US009829799B2

(12) United States Patent
Kolesnychenko et al.

(10) Patent No.: US 9,829,799 B2
(45) Date of Patent: *Nov. 28, 2017

(54) LITHOGRAPHIC APPARATUS AND DEVICE MANUFACTURING METHOD

(71) Applicant: ASML NETHERLANDS B.V., Veldhoven (NL)

(72) Inventors: Aleksey Yurievich Kolesnychenko, Helmond (NL); Johannes Jacobus Matheus Baselmans, Oirschot (NL); Sjoerd Nicolaas Lambertus Donders, 's-Hertogenbosch (NL); Christiaan Alexander Hoogendam, Veldhoven (NL); Hans Jansen, Eindhoven (NL); Jeroen Johannes Sophia Maria Mertens, Duizel (NL); Johannes Catharinus Hubertus Mulkens, Waalre (NL); Felix Godfried Peter Peeters, Lieshout (NL); Bob Streefkerk, Tilburg (NL); Franciscus Johannes Herman Maria Teunissen, Rotterdam (NL); Helmar Van Santen, Amsterdam (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/431,440

(22) Filed: Feb. 13, 2017

(65) Prior Publication Data

US 2017/0153557 A1    Jun. 1, 2017

Related U.S. Application Data

(63) Continuation of application No. 14/956,075, filed on Dec. 1, 2015, now Pat. No. 9,568,840, which is a
(Continued)

(51) Int. Cl.
*G03F 7/20* (2006.01)

(52) U.S. Cl.
CPC ...... *G03F 7/70341* (2013.01); *G03F 7/70733* (2013.01); *G03F 7/70866* (2013.01); *G03F 7/70908* (2013.01)

(58) Field of Classification Search
CPC .................. G03F 7/70341; G03F 7/70908
See application file for complete search history.

(56) References Cited

U.S. PATENT DOCUMENTS

| 3,573,975 A | 4/1971 | Dhaka et al. |
| 3,648,587 A | 3/1972 | Stevens |

(Continued)

FOREIGN PATENT DOCUMENTS

| CN | 1771463 | 5/2006 |
| CN | 100495214 C | 6/2009 |

(Continued)

OTHER PUBLICATIONS

M. Switkes et al., "Immersion Lithography at 157 nm", MIT Lincoln Lab, Orlando Jan. 2001, Dec. 17, 2001.
(Continued)

*Primary Examiner* — Michelle M Iacoletti
(74) *Attorney, Agent, or Firm* — Pillsbury Winthrop Shaw Pittman, LLP

(57) ABSTRACT

A substrate table of an immersion lithographic apparatus is disclosed which comprises a barrier configured to collect liquid. The barrier surrounds the substrate and is spaced apart from the substrate. In this way any liquid which is spilt from the liquid supply system can be collected to reduce the risk of contamination of delicate components of the lithographic projection apparatus.

20 Claims, 3 Drawing Sheets

Related U.S. Application Data continuation of application No. 14/273,310, filed on May 8, 2014, now Pat. No. 9,207,543, which is a continuation of application No. 13/240,711, filed on Sep. 22, 2011, now Pat. No. 8,755,033, which is a continuation of application No. 13/012,303, filed on Jan. 24, 2011, now Pat. No. 8,704,998, which is a continuation of application No. 10/823,777, filed on Apr. 14, 2004, now Pat. No. 7,898,642.

(56) References Cited

U.S. PATENT DOCUMENTS

| | | |
|---|---|---|
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 5,040,020 A | 8/1991 | Rauschenbach et al. |
| 5,118,957 A | 6/1992 | Kawashima et al. |
| 5,121,256 A | 6/1992 | Corle et al. |
| 5,448,332 A | 9/1995 | Sakakibara et al. |
| 5,610,683 A | 3/1997 | Takahashi |
| 5,715,039 A | 2/1998 | Fukuda et al. |
| 5,826,043 A | 10/1998 | Smith et al. |
| 5,900,354 A | 5/1999 | Batchelder |
| 6,191,429 B1 | 2/2001 | Suwa |
| 6,236,634 B1 | 5/2001 | Lee et al. |
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,952,253 B2 | 10/2005 | Lof et al. |
| 7,050,146 B2 | 5/2006 | Duineveld et al. |
| 7,075,616 B2 | 7/2006 | Derksen et al. |
| 7,193,232 B2 | 3/2007 | Lof et al. |
| 7,199,858 B2 | 4/2007 | Lof et al. |
| 7,213,963 B2 | 5/2007 | Lof et al. |
| 7,227,619 B2 | 6/2007 | Zaal et al. |
| 7,317,504 B2 | 1/2008 | De Smit |
| 7,326,522 B2 | 2/2008 | Dierichs |
| 7,359,030 B2 | 4/2008 | Simon et al. |
| 7,385,674 B2 | 6/2008 | Ishii |
| 7,471,371 B2 | 12/2008 | Kameyama |
| 7,483,119 B2 | 1/2009 | Owa et al. |
| 7,573,560 B2 | 8/2009 | Arai |
| 7,589,818 B2 | 9/2009 | Mulkens et al. |
| 7,589,820 B2 | 9/2009 | Nei et al. |
| 7,684,008 B2 | 3/2010 | De Smit |
| 7,898,642 B2 | 3/2011 | Kolesnychenko et al. |
| 2002/0020821 A1 | 2/2002 | Van Santen et al. |
| 2002/0163629 A1 | 11/2002 | Switkes et al. |
| 2003/0030916 A1 | 2/2003 | Suenaga |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0119795 A1 | 6/2004 | Noolandi et al. |
| 2004/0119954 A1 | 6/2004 | Kawashima et al. |
| 2004/0125351 A1 | 7/2004 | Krautschik et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0258824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam |
| 2005/0036183 A1 | 2/2005 | Yeo et al. |
| 2005/0036184 A1 | 2/2005 | Yeo et al. |
| 2005/0036213 A1 | 2/2005 | Mann et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0134815 A1 | 6/2005 | Van Santen et al. |
| 2005/0141098 A1 | 6/2005 | Schuster |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0231694 A1 | 10/2005 | Kolesnychenko et al. |
| 2006/0023181 A1 | 2/2006 | Novak |
| 2006/0023182 A1 | 2/2006 | Novak et al. |
| 2006/0077366 A1 | 4/2006 | Shafer et al. |
| 2006/0103832 A1 | 5/2006 | Hazelton et al. |
| 2006/0139594 A1 | 6/2006 | Hara et al. |
| 2006/0146305 A1 | 7/2006 | Magome et al. |
| 2006/0238730 A1 | 10/2006 | Nei et al. |
| 2007/0115450 A1 | 5/2007 | Nagasaka et al. |

FOREIGN PATENT DOCUMENTS

| | | |
|---|---|---|
| DE | 206 607 | 2/1984 |
| DE | 221 563 | 4/1985 |
| DE | 224448 | 7/1985 |
| DE | 242880 | 2/1987 |
| EP | 0 023 231 | 2/1981 |
| EP | 0 418 427 | 3/1991 |
| EP | 0 834 773 | 4/1998 |
| EP | 1 039 511 | 9/2000 |
| EP | 1 420 300 | 5/2004 |
| EP | 1 429 188 A2 | 6/2004 |
| EP | 1 429 188 A3 | 10/2004 |
| EP | 1 528 431 | 5/2005 |
| EP | 1 783 556 | 5/2007 |
| FR | 2474708 | 7/1981 |
| JP | 57-153433 | 9/1982 |
| JP | 58-202448 | 11/1983 |
| JP | 59-19912 | 2/1984 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 05-62877 | 3/1993 |
| JP | 05-304072 | 11/1993 |
| JP | 06-124873 | 5/1994 |
| JP | 06-168866 | 6/1994 |
| JP | 06-181157 | 6/1994 |
| JP | 07-132262 | 5/1995 |
| JP | 07-220990 | 8/1995 |
| JP | 08-316125 | 11/1996 |
| JP | 10-116760 | 5/1998 |
| JP | 10-154659 | 6/1998 |
| JP | 10-228661 | 8/1998 |
| JP | 10-255319 | 9/1998 |
| JP | 10-258249 | 9/1998 |
| JP | 10-303114 | 11/1998 |
| JP | 10-340846 | 12/1998 |
| JP | 11-016816 | 1/1999 |
| JP | 11-040484 | 2/1999 |
| JP | 11-166990 | 6/1999 |

(56) References Cited

FOREIGN PATENT DOCUMENTS

| | | |
|---|---|---|
| JP | 11-176727 | 7/1999 |
| JP | 2000-058436 | 2/2000 |
| JP | 2000-147788 | 5/2000 |
| JP | 2001-091849 | 4/2001 |
| JP | 2001-320837 | 11/2001 |
| JP | 2003-173975 | 6/2003 |
| JP | 2004-193252 | 7/2004 |
| JP | 2005-101488 | 4/2005 |
| JP | 2005-116571 | 4/2005 |
| JP | 2005-129914 | 5/2005 |
| JP | 2005-159322 | 6/2005 |
| JP | 2005-183656 | 7/2005 |
| JP | 2005-183709 | 7/2005 |
| JP | 2005-191557 | 7/2005 |
| JP | 2005-209705 | 8/2005 |
| JP | 2005-243686 | 9/2005 |
| JP | 2005-259870 | 9/2005 |
| JP | 2005-268742 | 9/2005 |
| JP | 2005-268759 | 9/2005 |
| JP | 2005-277363 | 10/2005 |
| JP | 2005-302880 | 10/2005 |
| JP | 2006-173527 | 6/2006 |
| JP | 2006-523027 T | 10/2006 |
| JP | 4353179 | 10/2009 |
| JP | 4415939 | 2/2010 |
| JP | 4513747 | 7/2010 |
| JP | 4552853 | 9/2010 |
| JP | 2014-017527 | 1/2014 |
| WO | 99/49504 | 9/1999 |
| WO | 2002/091078 | 11/2002 |
| WO | 03/077036 | 9/2003 |
| WO | 03/077037 | 9/2003 |
| WO | 2004/019128 | 3/2004 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 | 7/2004 |
| WO | 2004/057589 | 7/2004 |
| WO | 2004/057590 | 7/2004 |
| WO | 2004/077154 | 9/2004 |
| WO | 2004/081666 | 9/2004 |
| WO | 2004/090577 | 10/2004 |
| WO | 2004/090633 | 10/2004 |
| WO | 2004/090634 | 10/2004 |
| WO | 2004/092830 | 10/2004 |
| WO | 2004/092833 | 10/2004 |
| WO | 2004/093130 | 10/2004 |
| WO | 2004/093159 | 10/2004 |
| WO | 2004-093160 | 10/2004 |
| WO | 2004/095135 | 11/2004 |
| WO | 2005/001432 | 1/2005 |
| WO | 2005/003864 | 1/2005 |
| WO | 2005/006026 | 1/2005 |
| WO | 2005/008339 | 1/2005 |
| WO | 2005/013008 | 2/2005 |
| WO | 2005/015283 | 2/2005 |
| WO | 2005/017625 | 2/2005 |
| WO | 2005/019935 | 3/2005 |
| WO | 2005/020299 | 3/2005 |
| WO | 2005/022266 | 3/2005 |
| WO | 2005/022615 | 3/2005 |
| WO | 2005/022616 | 3/2005 |
| WO | 2005/024325 | 3/2005 |
| WO | 2005/024517 | 3/2005 |
| WO | 2005/034174 | 4/2005 |
| WO | 2005/054953 | 6/2005 |
| WO | 2005/054955 | 6/2005 |
| WO | 2005/057636 | 6/2005 |
| WO | 2005/062128 | 7/2005 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B,J, Lin, "The Paths to Subhalf-Micrometer Optical Lithography", SPIE vol. 922, Optical/Laser Microlithography (1988), pp. 256-269.
G.W.W, Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A, Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", FUTURE FAB International, vol. 15, Jul. 11, 2003.
H. Kawata et al., "Fabrication of 0,2μm Fine Patterns Using Optical Projection Lithography with an Oil Immersion Lens", Jpn. J. Appl. Phys. vol. 31 (1992), pp. 4174-4177.
G. Owen et al., "1/8μm Optical Lithography", J. Vac. Sci, Technol, B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.
T. Matsuyama et al., "Nikon Projection Lens Update", SPIE Microlithography 2004, 5377-65, Mar. 2004.
"Depth-of-Focus Enhancement Using High Refractive Index Layer on the Imaging Layer", IBM Technical Disclosure Bulletin, vol. 27, No, 11, Apr. 1985, p. 6521.
A. Suzuki, "Lithography Advances on Multiple Fronts", EEdesign, EE Times, Jan. 5, 2004.
B. Lin, The $k_3$ coefficient in nonparaxial λ/NA scaling equations for resolution, depth of focus, and immersion lithography, J. Microlith., Microfab., Microsyst. 1(1):7-12 (2002).
English Translation of WO 99/49504 (dated Sep. 30, 1999).
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.

(56) References Cited

OTHER PUBLICATIONS

Optical Microlithography XVI, Proceedings of SPIE vol. 5040 (2003), "Immersion lithography; its potential performance and issues", Soichi Owa et al., pp. 724-733.
Information Disclosure Statement dated Oct. 19, 2006 for U.S. Appl. No. 11/473,147.
Non-Final Office Action, dated Mar. 20, 2007, issued for U.S. Appl. No. 11/473,147.
Notice of Reasons for Rejection for Japanese Patent Application No. 2005-115241 dated Apr. 25, 2008.
English translation of Official Action dated Jun. 27, 2008 in corresponding Chinese Application No. 200510064163.7.
Office Action dated Aug. 15, 20078 for ROC (Taiwan) Patent Application No. 094110734.
Final Office Action as issued for U.S. Appl. No, 11/473,147, dated Dec. 14, 2007.
Non-Final Office Action as issued for U.S. Appl. No. 11/473,147, dated Sep. 11, 2008.
Japanese Office Action dated Jun. 6, 2011 in corresponding Japanese Patent Application No. 2008-274721.
Japanese Office Action dated Jun. 2, 2011 in corresponding Japanese Patent Application No. 2008-274716.
Japanese Office Action dated Jun. 2, 2011 in corresponding Japanese Patent Application No. 2008-274725.
Japanese Office Action dated Feb. 6, 2012 in corresponding Japanese Patent Application No. 2008-274726.
Japanese Office Action dated Feb. 6, 2012 in corresponding Japanese Patent Application No. 2008-274728.
U.S. Office Action dated Mar. 18, 2013 in corresponding U.S. Appl. No. 13/012,303.
U.S. Office Action dated Sep. 11, 2013 in corresponding U.S. Appl. No. 13/012,303.
Taiwan Office Action dated Dec. 24, 2012 in corresponding Taiwan Patent Application No. 097145513.

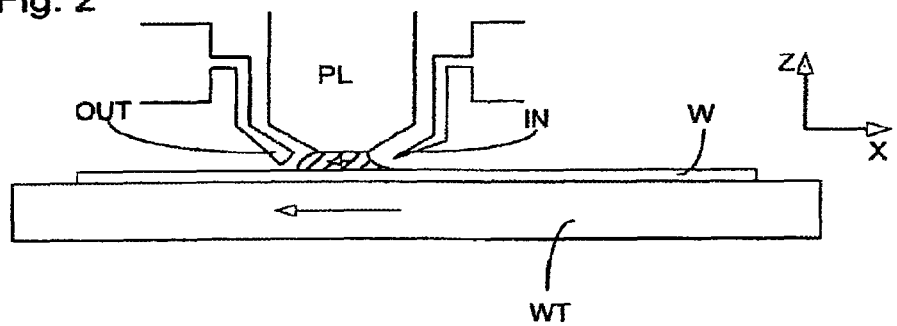
Fig. 2
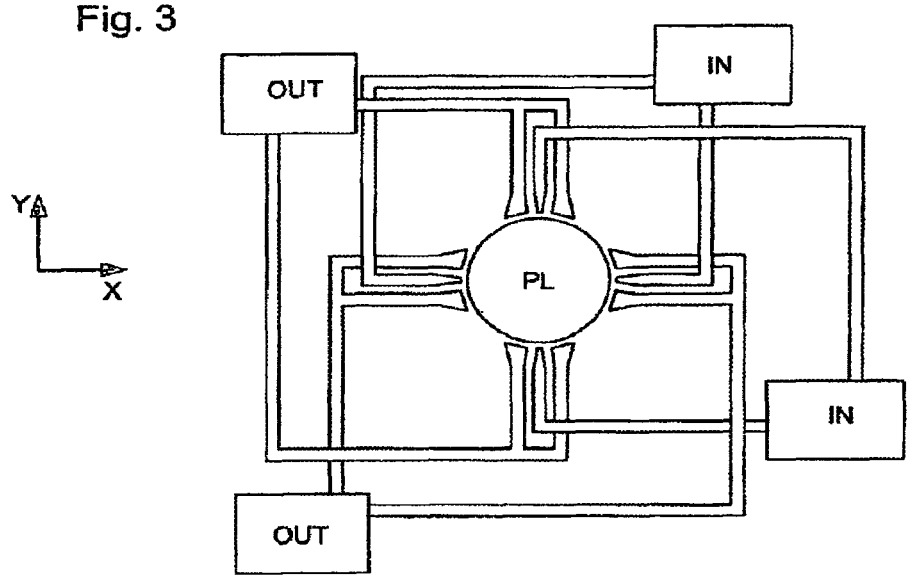
Fig. 3
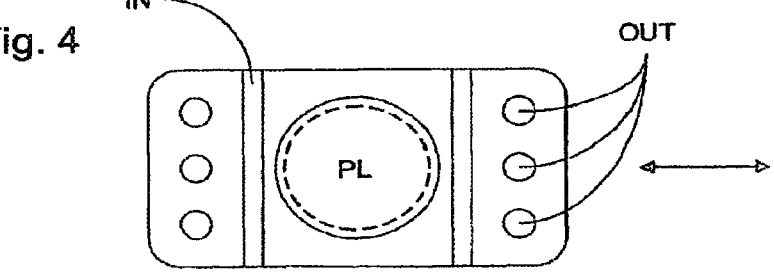
Fig. 4
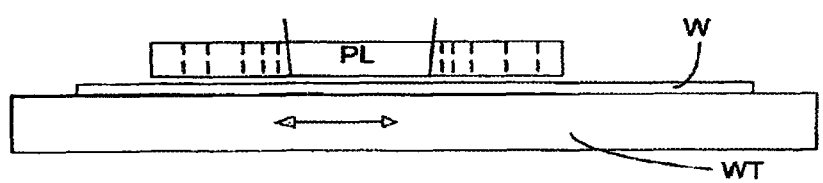

LITHOGRAPHIC APPARATUS AND DEVICE MANUFACTURING METHOD

This application is a continuation of U.S. patent application Ser. No. 14/956,075, filed Dec. 1, 2015, now allowed, which is a continuation of U.S. patent application Ser. No. 14/273,310, filed May 8, 2014, now U.S. Pat. No. 9,207,543, which is a continuation of U.S. patent application Ser. No. 13/240,711, filed Sep. 22, 2011, now U.S. Pat. No. 8,755,033, which is a continuation of U.S. patent application Ser. No. 13/012,303 filed Jan. 24, 2011, now U.S. Pat. No. 8,704,998, which is a continuation of U.S. patent application Ser. No. 10/823,777 filed Apr. 14, 2004, now U.S. Pat. No. 7,898,642, the entire contents of each of the foregoing applications is incorporated by reference herein.

FIELD

The present invention relates to a lithographic apparatus and a device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion at one time, and so-called scanners, in which each target portion is irradiated by scanning the pattern through the projection beam in a given direction (the "scanning"-direction) while synchronously scanning the substrate parallel or anti-parallel to this direction.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This may require additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Having immersion liquid inside the lithographic apparatus may present problems if the liquid is permitted to contaminate sensitive parts of the apparatus. This is particularly the case with a localized area liquid supply system because if such a liquid supply system fails, immersion liquid can easily escape. Furthermore, if the localized area liquid supply system is not efficient, immersion liquid can be left behind on the substrate table and then can leave the substrate table under the forces generated by the acceleration of the substrate table.

SUMMARY

Accordingly, it would be advantageous, for example, to reduce the risk of contamination with liquid of components in an immersion lithographic projection apparatus.

According to an aspect, there is provided a lithographic apparatus comprising:

an illuminator configured to provide a beam of radiation;

a support structure configured to hold a patterning device, the patterning device configured to impart the beam with a pattern in its cross-section;

a substrate table configured to hold a substrate;

a projection system configured to project the patterned beam onto a target portion of the substrate; and a liquid supply system configured to supply a liquid to a localized area of the substrate, the substrate table or both to at least partly fill a space between the projection system and the substrate, the substrate table or both, wherein the substrate table comprises a barrier configured to collect liquid, the barrier surrounding and spaced apart from the substrate.

Using the barrier, liquid spilt by the liquid supply system or escaping from the liquid supply system may be collected and recycled or disposed of without components in the apparatus being contaminated with the escaped liquid. The barrier need not take up very much space on the substrate table. This is advantageous because space is limited on the substrate table which is made as small as possible so that an as small as possible mass needs to be accelerated.

In an embodiment, the barrier comprises a projection which projects out of an upper surface of the substrate table. This is a simple physical barrier to prevent liquid from flying off the substrate table due to forces generated by the acceleration of the substrate table or because of catastrophic failure of the liquid supply system (e.g., according to any of the solutions described herein).

In an embodiment, at least a part of the barrier comprises a liquidphillic material or coating. Constructing the barrier of such a material or apply such a coating to the barrier enhances collection of liquid, which sticks to the barrier.

In an embodiment, the barrier comprises a groove recessed into an upper surface of the substrate table. This has an advantage that the cross-sectional profile of the substrate table has an upper surface which is generally level with an upper surface of the substrate. It is then not necessary to move the substrate table or the liquid supply system in the direction of the optical axis of the projection system to avoid collisions between the substrate table and the liquid supply system and/or the projection system, for example, during substrate swap.

In an embodiment, the groove is sized such that liquid can be transported along the groove under capillary action. Such sizing can facilitate transportation of liquid collected by the barrier to a low pressure supply configured to remove liquid from the barrier, without the need of any additional components. The substrate table may comprise a chamber in liquid contact with the upper surface via the groove. The groove may be made continuous. Using the chamber, the vacuum flow over a length of the groove may be equalized. In an embodiment, this may then require the use of a only few discrete outlets.

In an embodiment, a low pressure supply may be provided to remove liquid from the barrier. The low pressure supply may comprise individual discrete low pressure outlets, which may be provided to the groove or the chamber.

In an embodiment, the low pressure supply operates independently of the liquid supply system. In this way, in case of failure of the liquid supply system and therefore overflow of liquid, the barrier can still operate.

A way of transporting liquid along the barrier is to provide an acoustic wave generator configured to generate surface acoustic waves in the barrier. In an embodiment, this can be provided by the use of a piezoelectric actuator, which may advantageously be made quite small.

In an embodiment, the barrier comprises a groove and a projection which projects out of an upper surface of the substrate table. An advantage of this combination is, for example, that liquid with a high speed along the upper surface of the substrate table can be removed. The projection essentially acts as a dam and as liquid builds up against the dam it will be drained away via the groove. In combination with a chamber, which optionally may be at least partly formed in the projection, in liquid contact with the upper surface via the groove, a particularly effective barrier can be formed.

In an embodiment, the barrier is positioned radially outwardly of a drainage ditch or barrier surrounding an outer peripheral edge of the substrate. Such a drainage ditch or barrier surrounding an outer peripheral edge of the substrate is provided so that when edge portions of the substrate are being exposed and the localized area liquid supply system supplies liquid to areas both on the substrate and the substrate table simultaneously, the amount of liquid which escapes through the gap between the substrate and the substrate table is reduced. Examples of a drainage ditch or barrier surrounding an outer peripheral edge of the substrate can be found, for example, in U.S. patent application Ser. No. 10/705,804, hereby incorporated in its entirety by reference. Liquid which happens to escape the drainage ditch or barrier may be collected by the barrier. The barrier extends essentially around an outer edge or portion of the substrate table. Thus, with any relative position of the liquid supply system on the substrate table, the barrier can be used to collect liquid which is spilled. The barrier can additionally surround areas of an upper surface of the substrate table which are not covered by the substrate. Also, the barrier may additionally surround at least one sensor mounted on an upper surface of the substrate table and/or a closure member configured to seal the liquid supply system. The sensor may be a transmission image sensor used in alignment. The closure member may be in the form of a disk designed to be connected to the bottom of the liquid supply system to contain liquid in the liquid supply system, for example, during substrate swap after exposure of one substrate and before exposure of a following substrate. A typical example of a closure member is disclosed in U.S. patent application Ser. No. 10/705,785, hereby incorporated in its entirety by reference.

According to a further aspect, there is provided a device manufacturing method comprising:

providing a liquid to a localized area of a substrate, a substrate table or both to at least partly fill a space between a projection system and the substrate, the substrate table or both;

projecting a patterned beam of radiation through the liquid onto a target portion of the substrate using the projection system; and collecting liquid with a barrier, the barrier surrounding and spaced apart from the substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm).

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of a patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 illustrates, in cross-section, a liquid supply system which may be used in accordance with the present invention;

FIG. 3 illustrates, in plan, the liquid supply system of FIG. 2;

FIG. 4 illustrates an example of a liquid supply system seal member according to an embodiment of the invention;

DETAILED DESCRIPTION

Figure 1:
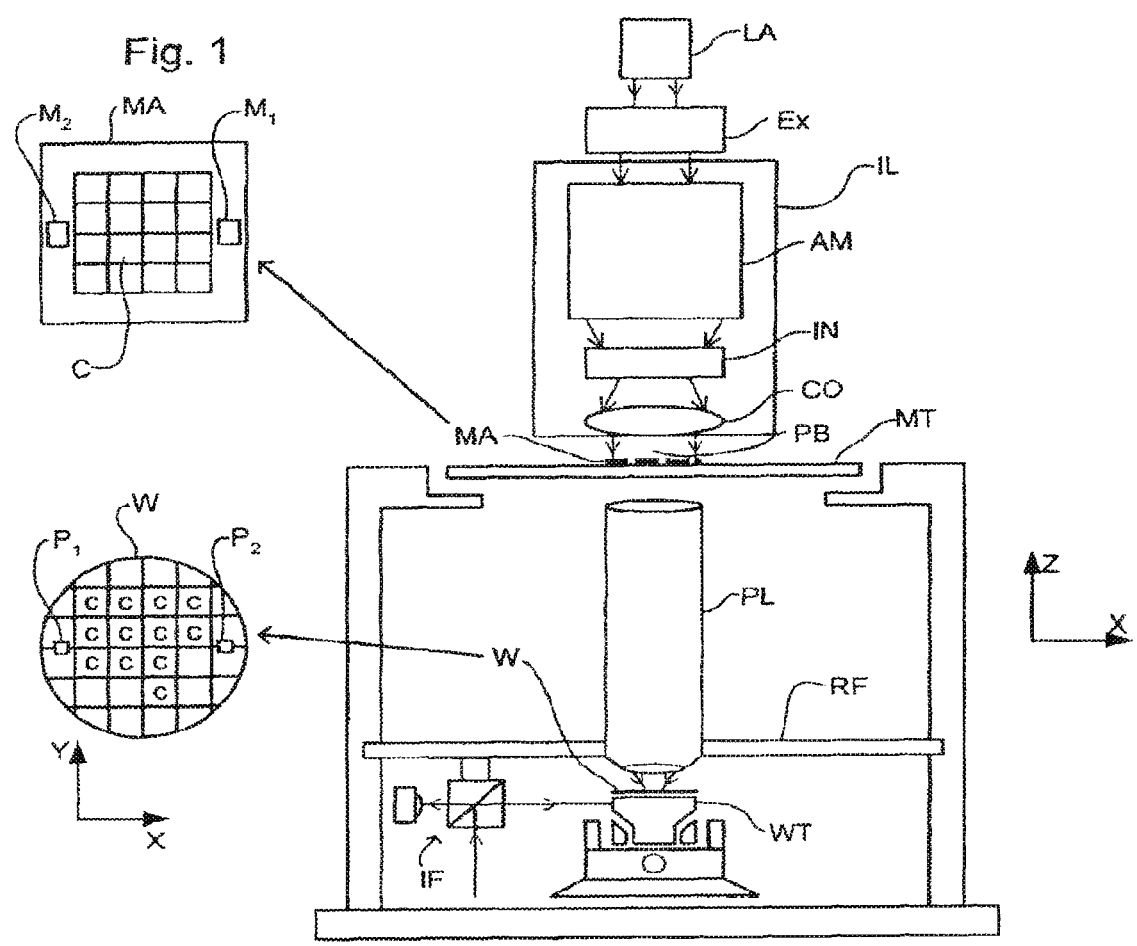
FIG. 1 depicts a lithographic apparatus according to an embodiment of the invention.

FIG. 1 schematically depicts a lithographic apparatus according to a particular embodiment of the invention. The apparatus comprises:
    an illumination system (illuminator) IL for providing a projection beam PB of radiation (e.g. UV radiation).
    a first support structure (e.g. a mask table) MT for supporting a patterning device (e.g. a mask) MA and connected to a first positioning device PM for accurately positioning the patterning device with respect to item PL;
    a substrate table (e.g. a wafer table) WT for holding a substrate (e.g. a resist-coated wafer) W and connected to a second positioning device for accurately positioning the substrate with respect to item PL; and
    a projection system (e.g. a refractive projection lens) PL for imaging a pattern imparted to the projection beam PB by the patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source. The source and the lithographic apparatus may be separate entities, for example when the source is an excimer laser. In such cases, the source is not considered to form part of the lithographic apparatus and the radiation beam is passed from the source to the illuminator IL with the aid of a beam delivery system comprising for example suitable directing mirrors and/or a beam expander. In other cases the source may be integral part of the apparatus, for example when the source is a mercury lamp. The source and the illuminator IL, together with the beam delivery system if required, may be referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the projection beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Figure 5:
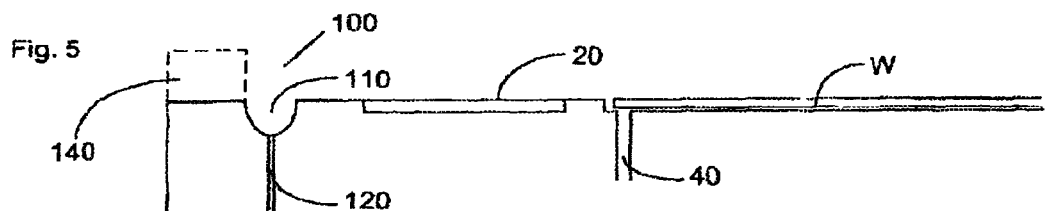
FIG. 5 illustrates, in cross-section, a barrier according to a first embodiment of the invention.

A first embodiment of the invention is described with reference to FIG. 5. A substrate table WT which supports a substrate W is illustrated. The substrate table WT may be any sort of substrate table including the type which comes in an upper and a lower part wherein the lower part moves relative to the apparatus and is designed for coarse positional movements and the upper part moves relative to the lower part and is designed for accurate "short-stroke" positioning. Further, the substrate table WT may be one of the type where a chuck is releasably attachable to the substrate table WT and supported by the substrate table WT. In the following description, no distinction shall be made between the different types of substrate table WT and the description of the substrate table WT will be generic.

A substrate table WT used in immersion lithography may be provided with a drainage ditch or barrier 40 surrounding an outer peripheral edge of the substrate W. The drainage ditch or barrier 40 is connected to a low pressure source such that immersion liquid spilt from the substrate W during exposure of edge portions of the substrate W can be retrieved. Examples of such a drainage ditch or barrier 40 can be found in U.S. patent application Ser. No. 10/705,804, hereby incorporated in its entirety by reference.

Figure 6:
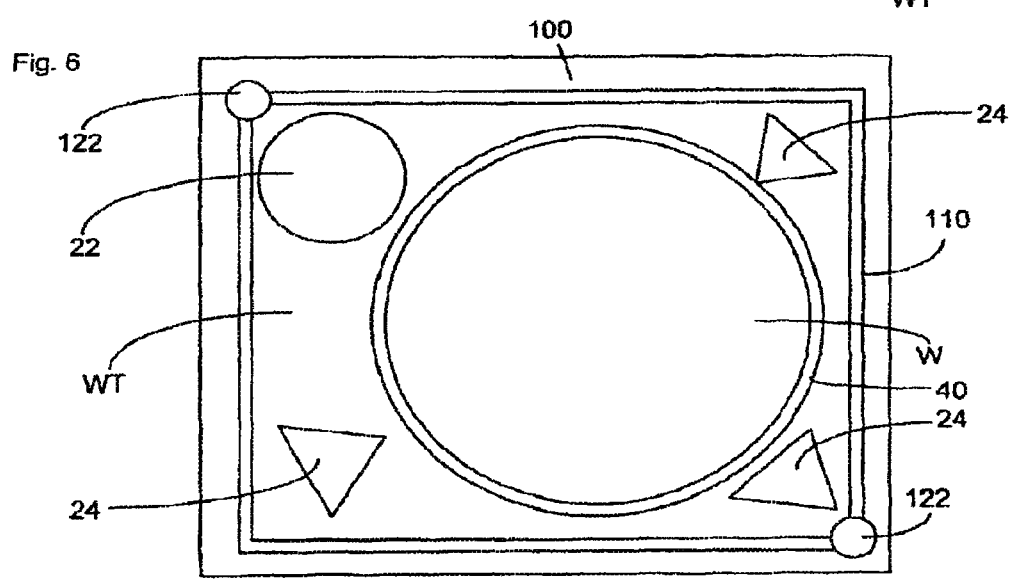
FIG. 6 illustrates, in plan, a barrier according to a second embodiment of the invention.

Further, other objects 20 are positioned on an upper surface of the substrate table which is substantially in the same plane as the upper surface of the substrate W. The other objects 20 may include sensors 24 (including, for example, a transmission image sensor (TIS) and/or a spot (dose) sensor) or a so-called closing disk 22 as shown in FIG. 6. A transmission image sensor 24 is used during alignment of the substrate W relative to the substrate table WT and is typically illuminated by a projection beam PB through the projection system. A closing disk 22 is typically used during substrate swap. After a substrate has been exposed, it is removed from the substrate table WT and replaced by a new, non-exposed substrate W. During this period it may be advantageous to maintain a final element of the projection system immersed in liquid to avoid drying marks on the final element. To this end, a closing disk 22 is provided which can be connected to the underside of the liquid supply system so that the liquid supply system may be maintained operational without catastrophic loss of liquid. A closing disk is described in more detail in U.S. patent application Ser. No. 10/705,785, hereby incorporated in its entirety by reference.

A barrier 100 surrounds the substrate W, the drainage ditch 40 and the closing disk 22 and the transmission image sensor 24. The barrier 100 also surrounds other areas of the upper surface of the substrate table WT. The barrier 100 is continuous and is positioned substantially at an outer edge or portion of the upper surface of the substrate table WT. The barrier 100 is physically out of the plane of the upper surface of the substrate table WT (and substrate W). For the type of substrate table WT which comprises a substrate chuck as well as the table, the barrier 100 may either be positioned around the outside of the chuck or around the outside of the substrate table.

In the first embodiment, the barrier 100 comprises a groove 110 which is recessed into the upper surface of the substrate table WT. The groove 110 is a continuous loop (whether circular or non-circular) but need not be. The groove 110 may be accompanied by a projection 140 which projects above the upper surface of the substrate table WT. In an embodiment, the projection 140 is positioned radially outwardly of the groove 110. A low pressure supply is attached to a plurality of discrete outlets 120. The discrete outlets 120 are connected to the low pressure supply, which is, in an embodiment, independent of the liquid supply system so that any liquid which is collected by the barrier 100 can be removed for disposal or optionally for recycling. In an embodiment, the outlet 120 may be a continuous loop (whether circular or non-circular).

The barrier 100 is advantageously made of a liquidphillic material or has a liquidphillic coating such that any liquid which comes into contact with the barrier 100 is attracted to the barrier 100 which can then work more effectively in collecting the liquid.

In an embodiment, the groove 100 is formed as a U-shape in cross-section and is sized such that capillary forces act on liquid in the groove so that the liquid can be transported to the outlet(s) 120 and removed from the substrate table WT.

An alternative for the transport of liquid along the barrier 100 is to generate surface acoustic waves which are a time-varying deformation or vibration on the surface and/or just below the surface of the barrier (e.g., a groove). The liquid is transported by the time varying deformation of the surface. The surface acoustic waves can be generated by a surface acoustic wave generator which may comprise piezo-electric actuators. This design is very compact and the surface acoustic waves can be generated very locally on the surface. Therefore, the surface acoustic waves will only run along the surface of the material of the barrier 100 so that no mechanical distortion of the substrate table (or chuck) occurs.

A second embodiment is described with reference to FIG. 6 and is the same as the first embodiment except as described below. In this embodiment, two collecting recesses 122 are provided at opposite corners of the barrier 100. The collecting recesses 122 are semi-spherical in shape and have at their deepest recessed point an outlet 120. The groove 110 may be slightly tilted along its length such that any liquid in the groove 110 will run under force of gravity towards the collecting recesses 122. Of course, the groove 110 may be sized such that capillary forces move the liquid towards the collecting recesses 122 or a surface acoustic wave generator may be employed for this purpose.

Figure 7:
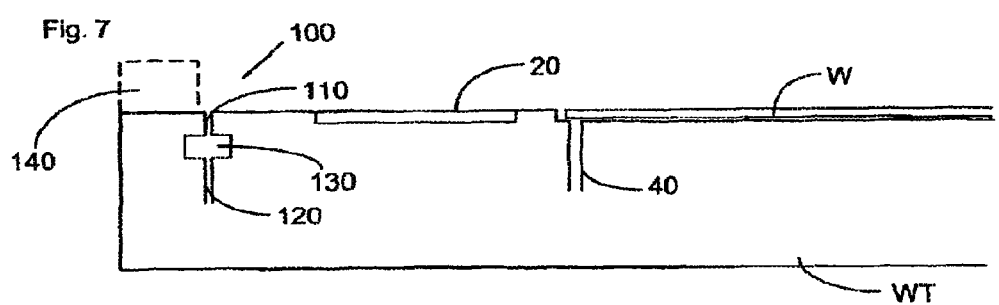
FIG. 7 illustrates, in cross-section, a barrier according to a third embodiment of the invention.

A third embodiment is described with reference to FIG. 7 and is the same as the first embodiment except as described below. In this embodiment, the barrier 100 comprises a continuous groove 110 extending around an outer edge or portion of the substrate table WT. The continuous groove 110 is in fluid communication with a continuous annular chamber 130 formed in the substrate table and which has a cross-sectional area larger than that of the groove. A plurality of discrete outlets 120 (or a single continuous outlet 120), which are connected to a low pressure source, are in fluid communication with the chamber 130. In this way, the under pressure in the groove 110 is equalized along its entire length so that the force which forces liquid into the drainage system is equal along the whole length of the barrier 100.

As in other embodiments but in contrast to the drainage ditch 40, the barrier 100 is spaced apart from the substrate W when the substrate W is positioned on the substrate table WT in the area designated for a substrate W.

Figure 8:
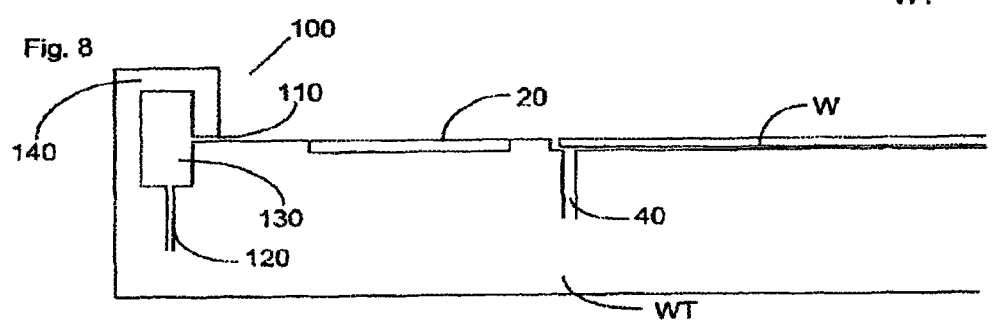
FIG. 8 illustrates, in cross-section, a barrier according to a fourth embodiment of the invention.

A fourth embodiment is the same as the third embodiment except as described below with reference to FIG. 8. The fourth embodiment is designed, for example, to optimize removal of liquid which has a high velocity on the upper surface of the substrate table WT. Liquid might develop a high velocity on the substrate table when the substrate table moves with high speed in the plane orthogonal to the optical axis of the projection system.

The barrier 100 of the fourth embodiment comprises a projection 140 which projects above the upper surface of the substrate table WT and extends around an outer edge or portion of the substrate table WT substantially at the outer edge or portion of the substrate table WT. A groove 110 is formed in the projection 140. The groove 110 extends horizontally substantially parallel to the upper surface of the substrate table WT in contrast to the grooves of the foregoing embodiments which are substantially perpendicular to the upper surface of the substrate table WT. However, in the fourth embodiment, as with the other embodiments, the groove 110 may make any angle with the upper surface of the substrate table WT. The horizontal angle of the groove 110, in the fourth embodiment, is preferred because when liquid is forced up against the radially inner surface of the projection 140, acceleration of the substrate table WT from the left to right as illustrated in FIG. 8 results in a force on the liquid which will be effective to force the liquid through the groove 110.

The inner surface of the projection 140 is illustrated as being perpendicular to the upper surface of the substrate table WT. This is perhaps the easiest shape to machine though an angle which results in the projection 140 overhanging the upper surface of the substrate table WT (i.e. angled inwardly) may be advantageous as liquid is then less likely to be forced over the top of the projection 140 as liquid builds up against the radially inner surface.

The chamber 130 of the fourth embodiment is formed at least partly in the projection 140. This need not necessarily be the case but it does make manufacture easier. In fact, the chamber 130 may be entirely formed within the projection 140. In this way the barrier 100 may be formed, for example, of an annular ring with a cross-sectional shape of a U which is glued or otherwise attached to the upper surface of the substrate table WT. As will be apparent, other shapes and cross-sections are possible.

Combinations and/or variations on the above described modes of use or entirely different modes of use may also be employed.

In an embodiment, there is provided a lithographic apparatus comprising: an illuminator configured to provide a beam of radiation; a support structure configured to hold a patterning device, the patterning device configured to impart the beam with a pattern in its cross-section; a substrate table configured to hold a substrate; a projection system configured to project the patterned beam onto a target portion of the substrate; and a liquid supply system configured to supply a liquid to a localized area of the substrate, the substrate table or both to at least partly fill a space between the projection system and the substrate, the substrate table or both, wherein the substrate table comprises a barrier configured to collect liquid, the barrier surrounding and spaced apart from the substrate.

In an embodiment, the barrier comprises a projection which projects out of an upper surface of the substrate table. In an embodiment, at least a part of the barrier comprises a liquidphillic material or coating. In an embodiment, the barrier comprises a groove recessed into an upper surface of the substrate table. In an embodiment, the groove is sized such that the liquid can be transported along the groove under capillary action. In an embodiment, the substrate table further comprises a chamber in liquid contact with the upper surface via the groove and wherein the groove forms a continuous loop. In an embodiment, the apparatus further comprises a low pressure supply configured to remove liquid from the barrier. In an embodiment, the low pressure supply comprises a plurality of discrete outlets. In an embodiment, the low pressure supply operates independently of the liquid supply system. In an embodiment, the apparatus further comprises a surface acoustic wave generator configured to generate surface acoustic waves in the barrier to facilitate transport of liquid along the barrier. In an embodiment, the surface acoustic wave generator comprises a piezoelectric actuator. In an embodiment, the barrier comprises a groove and a projection which projects out of an upper surface of the substrate table. In an embodiment, the substrate table comprises a chamber in liquid contact with the upper surface via the groove. In an embodiment, the chamber is at least partly formed in the projection. In an embodiment, the barrier is positioned radially outwardly of a drainage ditch or barrier surrounding an outer peripheral edge of the substrate. In an embodiment, the barrier extends substantially around an outer edge or portion of the substrate table. In an embodiment, the barrier additionally surrounds areas of an upper surface of the substrate table which are not covered by the substrate. In an embodiment, the barrier additionally surrounds at least one sensor mounted on an upper surface of the substrate table and/or a closure member configured to seal the liquid supply system.

In an embodiment, there is provided a device manufacturing method comprising: providing a liquid to a localized area of a substrate, a substrate table or both to at least partly fill a space between a projection system and the substrate, the substrate table or both; projecting a patterned beam of radiation through the liquid onto a target portion of the substrate using the projection system; and collecting liquid with a barrier, the barrier surrounding and spaced apart from the substrate.

In an embodiment, the barrier comprises a projection which projects out of an upper surface of the substrate table. In an embodiment, the barrier comprises a groove recessed into an upper surface of the substrate table. In an embodiment, the method further comprises removing liquid from the barrier using a low pressure supply. In an embodiment, removing liquid from the barrier operates independently of providing the liquid. In an embodiment, the method further comprises generating surface acoustic waves in the barrier to facilitate transport of liquid along the barrier. In an embodiment, the barrier comprises a groove and a projection which projects out of an upper surface of the substrate table. In an embodiment, the substrate table comprises a chamber at least partly formed in the projection and in liquid contact with the upper surface via the groove. In an embodiment, the method further comprises removing liquid using a drainage ditch or barrier surrounding an outer peripheral edge of the substrate and positioned radially inwardly of the barrier.

Another immersion lithography solution which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal. Such a system is disclosed in, for example, U.S. patent application Ser. No. 10/705,783, hereby incorporated in its entirety by reference.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European patent application no. 03257072.3, hereby incorporated in its entirety by reference, the idea of a twin or dual stage immersion lithography apparatus is disclosed. Such an apparatus is provided with two substrate tables for supporting the substrate. Leveling measurements are carried out with a substrate table at a first position, without immersion liquid, and exposure is carried out with a substrate table at a second position, where immersion liquid is present. Alternatively, the apparatus can have only one substrate table moving between the first and second positions.

The present invention can be applied to any immersion lithography apparatus, in particular, but not exclusively, to those types mentioned above.

While specific embodiments of the invention have been described above, it will be appreciated that the invention may be practiced otherwise than as described. The description is not intended to limit the invention.

The invention claimed is:

1. A lithographic apparatus, comprising:
   an object table comprising an upper surface, the object table comprising:
      a recess at the upper surface, the recess comprising a support surface configured to hold an object and having an inner periphery configured to form a first trench at the upper surface with an outer periphery of the object, the first trench configured to collect liquid and the first trench located horizontally outwardly of, and surrounding, the periphery of the object when held on the support surface, and
      a second trench at the upper surface, the second trench outward, relative to the support surface, of the first trench and the second trench surrounding the first trench, the second trench configured to move liquid by capillary action;
   a projection system configured to project a patterned beam of radiation; and
   a liquid supply system configured to supply the liquid to a localized area of the object, the object table or both the object and object table, to at least partly fill a space between the projection system and the object, the object table or both the object and object table.

2. The apparatus of claim 1, wherein the second trench forms a non-circular continuous loop.

3. The apparatus of claim 1, wherein the second trench comprises a plurality of discrete outlets to drain liquid in the second trench.

4. The apparatus of claim 3, wherein at least one outlet of the plurality of outlets is connected to a chamber, wherein the chamber has a cross-sectional width in a horizontal direction larger than that of the at least one outlet and the chamber comprises an opening at the bottom of the chamber to drain liquid, the opening having a cross-sectional width in a horizontal direction smaller than that of the chamber.

5. The apparatus of claim 3, wherein the second trench is generally U-shaped and has a plurality of openings of the outlets defined in a bottom of the second trench, the openings connected to a channel.

6. The apparatus of claim 1, further comprising a sensor system element and/or a removable member, located on an upper side of the table and located horizontally outward of the support surface, wherein the second trench is located adjacent the element and/or member.

7. The apparatus of claim 6, wherein the element and/or member is located between the first trench and the second trench.

8. A lithographic apparatus, comprising:
   an object table comprising an upper surface, the object table comprising:
      a recess at the upper surface, the recess comprising a support surface configured to hold an object and having an inner periphery configured to form a first trench at the upper surface with an outer periphery of the object, the first trench configured to collect liquid and the first trench located horizontally outwardly of, and surrounding, the periphery of the object when held on the support surface,
      one or more sensor system elements, located on an upper side of the table and located horizontally outward of the support surface, and
      a second trench at the upper surface, the second trench outward, relative to the support surface, of the first trench and the second trench comprising at least one linear trench segment located adjacent the one or more sensor system elements and the second trench configured to move liquid by capillary action;
   a projection system configured to project a patterned beam of radiation; and
   a liquid supply system configured to supply the liquid to a localized area of the object, the object table or both the object and object table, to at least partly fill a space between the projection system and the object, the object table or both the object and object table.

9. The apparatus of claim 8, wherein the second trench comprises at least four linear trench segments distributed around the support surface.

10. The apparatus of claim 8, wherein each trench segment is generally U-shaped and has a plurality of outlets therefrom.

11. The apparatus of claim 8, comprising a plurality of sensor system elements and a plurality of linear trench segments, each trench segment of the plurality of trench segments extending along a side of a respective sensor system element.

12. The apparatus of claim 8, further comprising a removable member and the removable member is located between the first trench and the second trench.

13. The apparatus of claim 8, wherein a bottom surface of the second trench is tilted.

14. A lithographic apparatus, comprising:
   an object table comprising an upper surface, the object table comprising:
      a recess at the upper surface, the recess comprising a support surface configured to hold an object and having an inner periphery configured to form a first trench at the upper surface with an outer periphery of the object, the first trench configured to collect liquid and the first trench located horizontally outwardly of, and surrounding, the periphery of the object when held on the support surface, and
      a second trench at the upper surface, the second trench outward, relative to the support surface, of the first trench and the second trench configured to move liquid by capillary action;
   a projection system configured to project a patterned beam of radiation; and
   a liquid supply system configured to supply the liquid to a localized area of the object, the object table or both the object and object table, to at least partly fill a space between the projection system and the object, the object table or both the object and object table.

15. The apparatus of claim 14, wherein the second trench comprises an outlet to drain liquid from the upper surface, and a chamber arranged to be in liquid contact with the upper surface via the outlet, the chamber having a cross-sectional width in a horizontal direction larger than that of an opening of the outlet.

16. The apparatus of claim 14, wherein the second trench comprises at least four linear trench segments distributed around the support surface.

17. The apparatus of claim 14, further comprising a sensor system element, located on an upper side of the table and located horizontally outward of the support surface, wherein the second trench is located adjacent the sensor system element.

18. The apparatus of claim 14, wherein the second trench comprises a plurality of discrete outlets to drain liquid in the second trench.

19. The apparatus of claim 14, further comprising a removable member and the removable member is located between the first trench and the second trench.

20. The apparatus of claim 14, wherein the second trench surrounds the first trench.

* * * * *

UNITED STATES PATENT AND TRADEMARK OFFICE
CERTIFICATE OF CORRECTION

PATENT NO. : 9,829,799 B2
APPLICATION NO. : 15/431440
DATED : November 28, 2017
INVENTOR(S) : Aleksey Yurievich Kolesnychenko et al.

It is certified that error appears in the above-identified patent and that said Letters Patent is hereby corrected as shown below:

On Page 2, Item (56) References Cited - U.S. Patent Documents, Column 1, Line 12:
Replace "5,826,043 10/1998 Smith et al."
With --5,825,043 10/1998 Suwa--.

Signed and Sealed this
Twenty-fourth Day of April, 2018

Andrei Iancu
*Director of the United States Patent and Trademark Office*